United States Patent
Heydron et al.

(10) Patent No.: US 9,766,270 B2
(45) Date of Patent: Sep. 19, 2017

(54) WIRELESS TEST MEASUREMENT (71) Applicant: Fluke Corporation, Everett, WA (US)

(72) Inventors: Paul Herman Heydron, Everett, WA (US); Jeetendra Patel, Norwich (GB); David Lawrence Epperson, Everett, WA (US)

(73) Assignee: Fluke Corporation, Everett, WA (US)

( * ) Notice: Subject to any disclaimer, the term of this patent is extended or adjusted under 35 U.S.C. 154(b) by 63 days.

(21) Appl. No.: 14/144,340

(22) Filed: Dec. 30, 2013

(65) Prior Publication Data
US 2015/0185251 A1 Jul. 2, 2015

(51) Int. Cl.
| | | |
|---|---|---|
| G01R 15/00 | (2006.01) | |
| G01R 1/067 | (2006.01) | |
| H04B 7/26 | (2006.01) | |
| G01R 1/02 | (2006.01) | |
| G01R 15/12 | (2006.01) | |
| G01R 31/28 | (2006.01) | |

(52) U.S. Cl.
CPC ......... *G01R 1/06788* (2013.01); *G01R 1/025* (2013.01); *G01R 15/00* (2013.01); *G01R 15/12* (2013.01); *G01R 31/28* (2013.01); *H04B 7/26* (2013.01)

(58) Field of Classification Search
CPC .... G01R 15/00; G01R 1/06788; G01R 31/28; G01R 1/025; G01R 15/12; H04B 7/26
USPC ........................................................ 324/754
See application file for complete search history.

(56) References Cited

U.S. PATENT DOCUMENTS

| | | |
|---|---|---|
| 4,644,320 A | 2/1987 | Carr et al. |
| 4,717,872 A | 1/1988 | Wagner et al. |
| 4,754,218 A | 6/1988 | Wagner et al. |
| 5,172,052 A | 12/1992 | Wells |
| 5,386,117 A | 1/1995 | Piety et al. |
| 5,428,342 A | 6/1995 | Enoki et al. |
| 5,594,332 A | 1/1997 | Harman et al. |

(Continued)

FOREIGN PATENT DOCUMENTS

| | | |
|---|---|---|
| CA | 2152024 A1 | 12/1995 |
| CN | 1237302 A | 12/1999 |

(Continued)

OTHER PUBLICATIONS

Bicelli et al., "From the Traditional Multimeter to the "Wireless Multimeter Networking"," Instrumentation and Measurement Technology Conference, Apr. 24-27, 2006, Sorrento, Italy, pp. 1581-1586.

(Continued)

*Primary Examiner* — Son Le
*Assistant Examiner* — Akm Zakaria
(74) *Attorney, Agent, or Firm* — Seed IP Law Group LLP (57) ABSTRACT

An installation test system has a control device and one or more hand-held test devices. The control device and the one or more hand-held devices are in wireless communication via respective communication systems. The control device performs typical pre-power tests including insulation testing and ground testing. There is at least one hand-held device dedicated to testing for residual current in circuit breakers and another hand-held device dedicated to testing for loop impedance. The control device records all test data and stores data in storage.

20 Claims, 5 Drawing Sheets

(56) References Cited

U.S. PATENT DOCUMENTS

| | | |
|---|---|---|
| 5,637,871 A | 6/1997 | Piety et al. |
| 5,650,771 A | 7/1997 | Lee |
| 5,664,207 A | 9/1997 | Crumpler et al. |
| 5,748,104 A | 5/1998 | Argyroudis et al. |
| 5,767,667 A | 6/1998 | Shafie |
| 5,992,237 A | 11/1999 | McCarty et al. |
| 6,202,491 B1 | 3/2001 | McCarty et al. |
| 6,219,340 B1 | 4/2001 | Cutler et al. |
| 6,229,526 B1 * | 5/2001 | Berstis .................. 345/158 |
| 6,243,105 B1 | 6/2001 | Hoyer et al. |
| 6,261,230 B1 | 7/2001 | Bardy |
| 6,280,380 B1 | 8/2001 | Bardy |
| 6,298,308 B1 | 10/2001 | Reid et al. |
| 6,336,900 B1 | 1/2002 | Alleckson et al. |
| 6,363,057 B1 | 3/2002 | Ardalan et al. |
| 6,363,488 B1 | 3/2002 | Ginter et al. |
| 6,437,692 B1 | 8/2002 | Petite et al. |
| 6,441,723 B1 | 8/2002 | Mansfield, Jr. et al. |
| 6,489,884 B1 | 12/2002 | Lamberson et al. |
| 6,496,705 B1 | 12/2002 | Ng et al. |
| 6,501,983 B1 | 12/2002 | Natarajan et al. |
| 6,571,140 B1 | 5/2003 | Wewalaarachchi et al. |
| 6,684,245 B1 | 1/2004 | Shuey et al. |
| 6,891,478 B2 | 5/2005 | Gardner |
| 6,934,862 B2 | 8/2005 | Sharood et al. |
| 6,985,819 B2 | 1/2006 | Lipscomb et al. |
| 6,993,417 B2 | 1/2006 | Osann, Jr. |
| 7,076,239 B2 | 7/2006 | Kirkup et al. |
| 7,149,285 B2 | 12/2006 | Kennedy et al. |
| 7,191,184 B2 | 3/2007 | Laborde et al. |
| 7,236,900 B2 | 6/2007 | Hagen et al. |
| 7,289,887 B2 | 10/2007 | Rodgers |
| 7,304,618 B2 | 12/2007 | Plathe |
| 7,310,583 B2 | 12/2007 | De La Quintana |
| 7,317,404 B2 | 1/2008 | Cumeralto et al. |
| 7,327,228 B2 | 2/2008 | Min et al. |
| 7,382,247 B2 | 6/2008 | Welch et al. |
| 7,385,524 B1 | 6/2008 | Orlosky |
| 7,423,985 B1 | 9/2008 | Hill |
| 7,424,527 B2 | 9/2008 | Petite |
| 7,454,050 B2 | 11/2008 | Garvey |
| 7,478,305 B2 | 1/2009 | Betawar et al. |
| 7,480,501 B2 | 1/2009 | Petite |
| 7,528,372 B2 | 5/2009 | Garvey, III et al. |
| 7,535,378 B2 | 5/2009 | Cornwall |
| 7,541,941 B2 | 6/2009 | Bogolea et al. |
| 7,561,200 B2 | 7/2009 | Garvey, III et al. |
| 7,561,867 B2 | 7/2009 | Frye, Jr. |
| 7,616,110 B2 | 11/2009 | Crump et al. |
| 7,703,032 B2 | 4/2010 | Wells |
| 7,706,596 B2 | 4/2010 | Garvey |
| 7,728,275 B2 | 6/2010 | Blanchard |
| 7,746,092 B2 | 6/2010 | Li |
| 7,791,351 B2 | 9/2010 | Raber |
| 7,902,507 B1 | 3/2011 | Garvey, III et al. |
| 7,960,965 B2 | 6/2011 | Lund |
| 7,995,830 B2 | 8/2011 | Garvey |
| 8,003,942 B2 | 8/2011 | Garvey, III et al. |
| 8,005,576 B2 | 8/2011 | Rodgers |
| 8,024,724 B2 | 9/2011 | Garrison Stuber et al. |
| 8,036,597 B2 | 10/2011 | Rahman et al. |
| 8,085,143 B2 | 12/2011 | Hollander et al. |
| 8,090,480 B2 | 1/2012 | Brumfield et al. |
| 8,094,034 B2 | 1/2012 | Patel et al. |
| 8,119,986 B1 | 2/2012 | Garvey, III et al. |
| 8,124,923 B2 | 2/2012 | Blanchard |
| 8,131,489 B2 | 3/2012 | Heuser et al. |
| 8,148,687 B1 | 4/2012 | Praly |
| 8,170,722 B1 | 5/2012 | Elberbaum |
| 8,233,486 B2 | 7/2012 | Phuah et al. |
| 8,269,650 B2 | 9/2012 | Cornwall et al. |
| 8,300,922 B1 | 10/2012 | Garvey, III |
| 8,319,658 B2 | 11/2012 | Conant et al. |
| 8,334,513 B1 | 12/2012 | Garvey, III et al. |
| 8,339,093 B2 | 12/2012 | Lu et al. |
| 8,358,903 B1 | 1/2013 | Meads et al. |
| 8,368,001 B2 | 2/2013 | Blanchard |
| 8,427,006 B2 | 4/2013 | Gilbert |
| 8,432,154 B2 | 4/2013 | Lund |
| 8,447,541 B2 | 5/2013 | Rada et al. |
| 8,450,995 B2 | 5/2013 | Wagner |
| 8,489,063 B2 | 7/2013 | Petite |
| 8,502,821 B2 | 8/2013 | Louise et al. |
| 8,576,231 B2 | 11/2013 | Woodings et al. |
| 8,581,743 B2 | 11/2013 | Chan et al. |
| 8,618,930 B2 | 12/2013 | Papadopoulos et al. |
| 8,639,465 B1 | 1/2014 | Elberbaum |
| 8,643,539 B2 * | 2/2014 | Pauly et al. .................. 342/173 |
| 8,707,193 B2 | 4/2014 | Khazanov et al. |
| 8,712,732 B2 | 4/2014 | Patel et al. |
| 8,754,779 B2 | 6/2014 | Ruther et al. |
| 8,836,318 B2 | 9/2014 | Cheng et al. |
| 8,870,086 B2 | 10/2014 | Tessier et al. |
| 8,884,553 B2 | 11/2014 | Hai |
| 8,976,039 B2 | 3/2015 | O'Hara et al. |
| 8,983,785 B2 | 3/2015 | Panko |
| 9,076,275 B2 | 7/2015 | Chinnadurai et al. |
| 9,117,251 B2 | 8/2015 | Schmidt et al. |
| 9,151,818 B2 | 10/2015 | Danesh et al. |
| 9,172,275 B2 | 10/2015 | Bhakta |
| 9,197,949 B2 | 11/2015 | Indovina et al. |
| 9,250,275 B2 | 2/2016 | Patel et al. |
| 9,408,250 B2 | 8/2016 | Yi et al. |
| 9,430,558 B2 | 8/2016 | Bhat et al. |
| 2001/0001850 A1 | 5/2001 | Miller |
| 2001/0025138 A1 | 9/2001 | Bardy |
| 2001/0038343 A1 | 11/2001 | Meyer et al. |
| 2001/0051764 A1 | 12/2001 | Bardy |
| 2002/0193144 A1 | 12/2002 | Belski et al. |
| 2003/0020759 A1 | 1/2003 | Cancilla et al. |
| 2003/0058243 A1 | 3/2003 | Faust et al. |
| 2003/0158677 A1 | 8/2003 | Swarztrauber et al. |
| 2004/0028023 A1 | 2/2004 | Mandhyan et al. |
| 2004/0140908 A1 | 7/2004 | Gladwin et al. |
| 2004/0197040 A1 | 10/2004 | Walker et al. |
| 2004/0227501 A1 | 11/2004 | Wobben |
| 2004/0249605 A1 | 12/2004 | Komatsu |
| 2004/0253997 A1 | 12/2004 | Kochie |
| 2005/0060107 A1 | 3/2005 | Rodenberg, III et al. |
| 2005/0065743 A1 | 3/2005 | Cumming et al. |
| 2005/0125512 A1 | 6/2005 | Fuller, III et al. |
| 2005/0171411 A1 | 8/2005 | KenKnight et al. |
| 2005/0194962 A1 | 9/2005 | Briese et al. |
| 2005/0212526 A1 * | 9/2005 | Blades .................. 324/543 |
| 2005/0225347 A1 * | 10/2005 | Khandros et al. ............ 324/763 |
| 2006/0062190 A1 | 3/2006 | Suga |
| 2006/0071812 A1 | 4/2006 | Mason, Jr. et al. |
| 2006/0097713 A1 | 5/2006 | Brandt |
| 2006/0101311 A1 | 5/2006 | Lipscomb et al. |
| 2006/0145890 A1 | 7/2006 | Junker et al. |
| 2006/0167638 A1 | 7/2006 | Murphy et al. |
| 2006/0189871 A1 | 8/2006 | Al-Ali et al. |
| 2007/0007968 A1 | 1/2007 | Mauney, Jr. et al. |
| 2007/0057814 A1 | 3/2007 | Goldberg et al. |
| 2007/0083307 A1 | 4/2007 | Pasztor et al. |
| 2007/0100520 A1 | 5/2007 | Shah et al. |
| 2007/0100666 A1 | 5/2007 | Stivoric et al. |
| 2007/0118310 A1 | 5/2007 | Kindseth et al. |
| 2007/0118323 A1 | 5/2007 | Ishizuka |
| 2007/0156313 A1 | 7/2007 | Fudali et al. |
| 2007/0198222 A1 | 8/2007 | Schuster et al. |
| 2007/0297112 A1 | 12/2007 | Gilbert |
| 2008/0012701 A1 | 1/2008 | Kass et al. |
| 2008/0036466 A1 * | 2/2008 | Raber .................. 324/509 |
| 2008/0042641 A1 | 2/2008 | Stockman |
| 2008/0046387 A1 | 2/2008 | Gopal et al. |
| 2008/0077336 A1 | 3/2008 | Fernandes |
| 2008/0082278 A1 | 4/2008 | Tan et al. |
| 2008/0091345 A1 | 4/2008 | Patel et al. |
| 2008/0161957 A1 | 7/2008 | Rice et al. |
| 2008/0224892 A1 | 9/2008 | Bogolea et al. |
| 2008/0231719 A1 | 9/2008 | Benson et al. |
| 2009/0072985 A1 | 3/2009 | Patel et al. |
| 2009/0128124 A1 | 5/2009 | Garland et al. |

(56) References Cited

U.S. PATENT DOCUMENTS

| | | |
|---|---|---|
| 2009/0128127 A1 | 5/2009 | Garland et al. |
| 2009/0128128 A1 | 5/2009 | Garland et al. |
| 2009/0135836 A1 | 5/2009 | Veillette |
| 2009/0141593 A1 | 6/2009 | Taha |
| 2009/0150509 A1 | 6/2009 | Chang et al. |
| 2009/0292486 A1 | 11/2009 | Van Gorp et al. |
| 2009/0299940 A1 | 12/2009 | Hayes et al. |
| 2009/0315725 A1 | 12/2009 | Hollander et al. |
| 2009/0326410 A1 | 12/2009 | James et al. |
| 2010/0005331 A1 | 1/2010 | Somasundaram et al. |
| 2010/0014746 A1 | 1/2010 | Warnke et al. |
| 2010/0030289 A1 | 2/2010 | Casavant et al. |
| 2010/0058222 A1 | 3/2010 | Bergstrom et al. |
| 2010/0102926 A1 | 4/2010 | Grieve et al. |
| 2010/0109842 A1 | 5/2010 | Patel et al. |
| 2010/0167659 A1 | 7/2010 | Wagner |
| 2010/0174419 A1 | 7/2010 | Brumfield et al. |
| 2010/0214299 A1 | 8/2010 | Robertson et al. |
| 2010/0217099 A1 | 8/2010 | LeBoeuf et al. |
| 2010/0218305 A1 | 9/2010 | Weston et al. |
| 2010/0244868 A1* | 9/2010 | Cantave et al. ............ 324/754 |
| 2010/0331651 A1 | 12/2010 | Groll |
| 2011/0012587 A1 | 1/2011 | Greenberg |
| 2011/0039571 A1 | 2/2011 | Bodine et al. |
| 2011/0085461 A1 | 4/2011 | Liu et al. |
| 2011/0087461 A1 | 4/2011 | Hollander et al. |
| 2011/0099424 A1 | 4/2011 | Rivera et al. |
| 2011/0101956 A1 | 5/2011 | Thorn |
| 2011/0115640 A1 | 5/2011 | Jiang et al. |
| 2011/0122251 A1 | 5/2011 | Schmidt |
| 2011/0153236 A1 | 6/2011 | Montreuil et al. |
| 2011/0184267 A1 | 7/2011 | Duke et al. |
| 2011/0199916 A1 | 8/2011 | Garrett et al. |
| 2011/0200045 A1 | 8/2011 | Baehre |
| 2011/0212700 A1 | 9/2011 | Petite |
| 2011/0248857 A1 | 10/2011 | Rutherford et al. |
| 2011/0285546 A1 | 11/2011 | Vadali |
| 2011/0288810 A1 | 11/2011 | Ishikawa et al. |
| 2011/0298301 A1 | 12/2011 | Wong et al. |
| 2011/0307418 A1 | 12/2011 | Bouzaglo |
| 2011/0309820 A1 | 12/2011 | Khanke et al. |
| 2012/0001768 A1 | 1/2012 | Radosavljevic et al. |
| 2012/0004886 A1 | 1/2012 | Jordil et al. |
| 2012/0007588 A1 | 1/2012 | Tan |
| 2012/0026005 A1 | 2/2012 | Myoung et al. |
| 2012/0029718 A1 | 2/2012 | Davis |
| 2012/0045988 A1 | 2/2012 | Blanton et al. |
| 2012/0046897 A1 | 2/2012 | Panko |
| 2012/0047424 A1 | 2/2012 | Rothschild |
| 2012/0083682 A1 | 4/2012 | Klodell et al. |
| 2012/0119791 A1 | 5/2012 | Hsiao |
| 2012/0130223 A1 | 5/2012 | Reicher |
| 2012/0138388 A1 | 6/2012 | Finschi et al. |
| 2012/0139952 A1 | 6/2012 | Imai et al. |
| 2012/0143387 A1 | 6/2012 | Indovina et al. |
| 2012/0146788 A1 | 6/2012 | Wilson et al. |
| 2012/0154404 A1 | 6/2012 | Clement et al. |
| 2012/0157009 A1 | 6/2012 | Hollander et al. |
| 2012/0172023 A1 | 7/2012 | Griff et al. |
| 2012/0178438 A1 | 7/2012 | Vashi et al. |
| 2012/0187883 A1 | 7/2012 | Valdez et al. |
| 2012/0224067 A1 | 9/2012 | Stuart et al. |
| 2012/0229270 A1 | 9/2012 | Morley et al. |
| 2012/0245878 A1 | 9/2012 | Kane et al. |
| 2012/0265586 A1 | 10/2012 | Mammone |
| 2012/0270505 A1 | 10/2012 | Prakash et al. |
| 2012/0271557 A1 | 10/2012 | Sekimoto et al. |
| 2012/0275651 A1 | 11/2012 | Brown |
| 2012/0278014 A1 | 11/2012 | Davies |
| 2012/0300089 A1 | 11/2012 | Sbaiz et al. |
| 2012/0310558 A1 | 12/2012 | Taft |
| 2012/0320189 A1 | 12/2012 | Stuart et al. |
| 2013/0009788 A1 | 1/2013 | Langenberg et al. |
| 2013/0024149 A1 | 1/2013 | Nayar et al. |
| 2013/0029683 A1 | 1/2013 | Kim et al. |
| 2013/0050246 A1 | 2/2013 | Barry et al. |
| 2013/0051498 A1 | 2/2013 | Taft |
| 2013/0065633 A1 | 3/2013 | Sridhara et al. |
| 2013/0066576 A1 | 3/2013 | Cs et al. |
| 2013/0124136 A1 | 5/2013 | Neeley et al. |
| 2013/0127904 A1 | 5/2013 | Dove et al. |
| 2013/0137940 A1 | 5/2013 | Schafer |
| 2013/0147464 A1 | 6/2013 | Tan |
| 2013/0150744 A1 | 6/2013 | Brattain et al. |
| 2013/0197835 A1* | 8/2013 | Jonsson et al. ............ 702/62 |
| 2013/0204554 A1 | 8/2013 | Tuckey et al. |
| 2013/0211731 A1 | 8/2013 | Woltman |
| 2013/0241746 A1 | 9/2013 | McKinley et al. |
| 2013/0249917 A1 | 9/2013 | Fanning et al. |
| 2013/0261821 A1 | 10/2013 | Lu et al. |
| 2013/0271467 A1 | 10/2013 | Misumi |
| 2013/0307992 A1 | 11/2013 | Erlandsson et al. |
| 2013/0338958 A1 | 12/2013 | Shanishchara et al. |
| 2013/0344888 A1 | 12/2013 | Dousse |
| 2014/0018111 A1 | 1/2014 | Farley et al. |
| 2014/0035607 A1 | 2/2014 | Heydron et al. |
| 2014/0039838 A1 | 2/2014 | Katz et al. |
| 2014/0051941 A1 | 2/2014 | Messerschmidt |
| 2014/0152667 A1 | 6/2014 | Li et al. |
| 2014/0191573 A1 | 7/2014 | Chen et al. |
| 2014/0218383 A1 | 8/2014 | Srivastava |
| 2014/0232549 A1 | 8/2014 | Shin et al. |
| 2014/0267294 A1 | 9/2014 | Ma et al. |
| 2014/0267296 A1 | 9/2014 | Neeley et al. |
| 2014/0274114 A1 | 9/2014 | Rowitch |
| 2014/0277827 A1 | 9/2014 | Chinnadurai et al. |
| 2014/0278255 A1 | 9/2014 | Anderson |
| 2014/0278259 A1 | 9/2014 | Neeley et al. |
| 2014/0282241 A1 | 9/2014 | Epperson et al. |
| 2014/0300486 A1 | 10/2014 | Hummel et al. |
| 2014/0376377 A1 | 12/2014 | Mikoda et al. |
| 2015/0012147 A1 | 1/2015 | Haghighat-Kashani et al. |
| 2015/0022181 A1 | 1/2015 | Anderson et al. |
| 2015/0133167 A1 | 5/2015 | Edge |
| 2015/0160284 A1 | 6/2015 | Cern |
| 2015/0276816 A1 | 10/2015 | Yoshida et al. |
| 2015/0276830 A1 | 10/2015 | Airaksinen et al. |
| 2016/0231372 A1 | 8/2016 | Wootton et al. |
| 2016/0232457 A1 | 8/2016 | Gray et al. |
| 2016/0349954 A1 | 12/2016 | Thompson et al. |

FOREIGN PATENT DOCUMENTS

| | | |
|---|---|---|
| CN | 1443404 A | 9/2003 |
| CN | 101061523 A | 10/2007 |
| CN | 101326479 A | 12/2008 |
| CN | 101498744 A | 8/2009 |
| CN | 102188263 A | 9/2011 |
| CN | 202351298 U | 7/2012 |
| EP | 1 560 121 A1 | 8/2005 |
| EP | 1 710 593 A2 | 10/2006 |
| EP | 2 026 080 A2 | 2/2009 |
| EP | 2 889 630 A1 | 7/2015 |
| KR | 10 2008 0112692 A | 12/2008 |
| KR | 10 2012 0065540 A | 6/2012 |
| KR | 10 2012 0077332 A | 7/2012 |
| WO | 2013/020110 A2 | 2/2013 |

OTHER PUBLICATIONS

Extended European Search Report, dated Jun. 1, 2015, for corresponding EP Application No. 14200521.4-1560, 9 pages.
Fluke Corporation, "1652C/1653B/1654B Electrical Installation Tester Users Manual," Sep. 2010, 66 pages.
Fluke Corporation, "Basic electrical installation testing," Application Note, 2014, 4 pages.
Fluke Corporation, "Performing Live-Circuit Installation Tests with a Fluke 1650 series Tester on an IT-system," Application Note, 2004, 8 pages.
Fluke Corporation, "Testing RCDs with the Fluke 1650B Series," Application Note, 2014, 2 pages.
Fluke Corporation, "The importance of loop impedance testing," Application Note, 2003, 2 pages.

(56) References Cited

OTHER PUBLICATIONS

Office Action, for Chinese Application No. 201480027748.9, dated Nov. 2, 2016, 22 pages. (with English Translation).
Office Action, mailed Oct. 31, 2016, for Chinese Application No. 201310334993.1, 30 pages. (with English Translation).
Extended European Search Report, mailed Oct. 20, 2016, for European Application No. 14762404.3-1568 / 2973108, 7 pages.
Fluke Corporation, "What you can learn from loop impedance testing on a branch circuit", Mar. 2004, 2140194 A-ENG-N Rev. A, 3 pages.
Extended European Search Report, mailed Sep. 10, 2013, for European Application No. 13178211.2-1853, 8 pages.
Extended European Search Report, dated Nov. 11, 2013, for European Application No. 13178568.5-1560, 8 pages.
Extech Instruments, "Extech EX540 Wireless Datalogging selected as 2010 EC&M Product of the Year Category Winner," Press Release, Mar. 18, 2009, 2 pages.
Extech Instruments, "Extech EX845 METERLiNK™ Clamp Meter Transmit Readings to FLIR IR Cameras," Press Release, Apr. 1, 2010, 3 pages.
Extech Instruments, "MultiMeter/Datalogger with Wireless PC Interface," Product Datasheet, Jul. 14, 2011, 1 page.
Extech Instruments, "Wireless TRMS Multimeter—Model EX540," User's Guide, Apr. 1, 2010, 17 pages.

"Fluke 3000 FC Fluke Connect Series Wireless Digital Multimeter," retrieved from http://www.testequity.com/products/5220, retrieved on Sep. 1, 2015, 2 pages.
Hoh et al., "Wireless Remote Connectivity with Handheld Digital Multimeters," 2012, retrieved from, http://www.wirelessdesignmag.com/blog/2012/03/wireless-remote-connectivity-handheld-digital-multimeters, retrieved on Sep. 1, 2015, 6 pages.
International Search Report, dated Jul. 10, 2014, for International Application No. PCT/US2014/029561, 2 pages.
International Search Report and Written Opinion, dated Sep. 12, 2014, for International Application No. PCT/US2014/029867, 12 pages.
International Search Report and Written Opinion, dated Jul. 24, 2014, for International Application No. PCT/US2014/029879, 12 pages.
International Search Report and Written Opinion, dated Jul. 22, 2014, for International Application No. PCT/US2014/029883, 13 pages.
International Search Report and Written Opinion, dated Jul. 18, 2014, for International Application No. PCT/US2014/029885, 16 pages.
International Search Report and Written Opinion, dated Jul. 17, 2014, for International Application No. PCT/US2014/029889, 13 pages.
Redfish Instruments, "iDVM," Screenshot, retrieved from http://appshopper.com/utilities/idvm, retrieved 2013, 2 pages.
Redfish Instruments, "iDVM v1.0 User's Guide," 2013, 21 pages.

\* cited by examiner

WIRELESS TEST MEASUREMENT

CROSS-REFERENCE TO RELATED APPLICATIONS

This application is related to U.S. application Ser. Nos. 13/830,556 and 13/830,772, both filed on Mar. 3, 2013, and are herein incorporated by reference in their entirety.

BACKGROUND

Municipal jurisdictions have building codes and construction regulations that set standards for proper installation of electrical power and distribution circuits in all structures, including residences and industrial and commercial premises. Most jurisdictions require visual inspection of electrical installations before power may be turned on for a building. Some jurisdictions, such as in Europe, Australia, and New Zealand, require an actual test before power is connected to a building, more tests after power is connected, and annual tests of all circuits to ensure the safety of the electrical service to the building.

For new installations, inspectors will perform one or more tests before power is connected. These tests include insulation testing and ground testing. Each circuit is tested to see if its resistance is proper. A 500 V DC voltage is applied to each circuit and the resistance is measured. A short circuit or a breakdown or degradation of the wiring insulation will be detected by a voltage drop. Such short circuits may occur, for example, due to a nail piercing a conductor and shorting one phase line to another phase line. Another pre-power test is a test made on the electrical ground of the building.

If the electrical distribution system of the building passes the pre-power tests, power is connected and the inspector performs another series of tests, such as a residual current detection (RCD) test and a loop impedance test. In Europe, circuit breakers are equipped with ground fault detection and interruption circuits. Before a new building may be occupied, each breaker is individually tested to insure it is properly working. In commercial and industrial buildings, the circuit breakers are often located in one room. As such, the breaker room may have hundreds of circuit breakers, each of which is individually tested. After completing the circuit breaker tests, the inspector performs a loop impedance test on each outlet.

RCD Test

An RCD test detects fault currents flowing to earth (ground) that are too small to trip over-current protection devices. In other words, a fuse or circuit breaker designed for a particular current and voltage may not detect a lower but faulty current that is still sufficient to cause electrical shock or an electrical fire. Basic testing of RCDs involves determining the tripping time (in milliseconds) by inducing a fault current in the circuit.

Loop Impedance Test

Earth loop impedance testing is essential to discover whether a live conductor is accidentally connected to an earth conductor in a faulty appliance or circuit. If so, the resulting short-circuit current to earth may be high enough to cause electric shock or generate enough heat to start a fire. Normally, the fuse will blow or another circuit protection device will trip, but a situation may arise where the actual short-circuit current in a faulty installation is of insufficient level and the protection device would thus take too long to activate. The delay can be disastrous for life and property. It is therefore necessary to know if the impedance of the path that any fault current would take is low enough to allow sufficient current to flow in the event of a fault and that any installed protective device will operate within a safe time limit.

A loop test is performed on each outlet. The test requires inserting a known, low resistance between one phase line and the neutral line and measuring the voltage drop across the known resistor, which in turn gives a measure of the total loop resistance. The resistance of the known resistor is subtracted from the total resistance to give the resistance of the fault loop. The duration of the test must be limited to one or two cycles of the voltage or else the inserted known resistance may trip the circuit breaker.

Multifunction Tester

The foregoing pre-power and power-on tests are normally performed by a technician using a multifunction test device, including, and not limited to, the 1650 Series Multifunction Installation Testers made by Fluke Corporation. Those installation testers have an oblong body with a central display, a rotary dial knob on the right side of the display that indicates clearly which test is selected, and on the left-hand side, functional switches to set one or more parameters for the selected test. The installation testers have a padded strap that the technician places around his neck. The top of the display has input jacks for three input probes or a probe cord with a three-prong receptacle.

To perform an RCD test on a breaker with a rated current of 30 ma, an input probe from one jack is temporarily touched to one side of a breaker and a current of 30 ma is injected into the breaker. The technician holds the probe against a breaker terminal with one hand, and with the other hand, touches or flips an RCD test switch to apply 30 ma from the tester to the circuit breaker. The display indicates the test results, which the technician may save in tester memory. The foregoing procedure is repeated for each circuit breaker.

Although 30 ma is a low current, the repetition of tests on multiple circuit breakers generates heat. At times, the installation device may become too hot to operate and must be allowed to cool down. The interruption of RCD testing reduces the efficiency of the overall testing operation. It is also possible the technician may be distracted and slip the probe off the circuit breaker when he looks at the display to confirm the reading. It is possible the probe could short out one or more breakers when it slips.

To perform loop testing, the technician locates each outlet, unplugs any equipment at the outlet, and runs a loop resistance test. The outlet may be obstructed by equipment or furniture. Nevertheless, the technician, with the tester hanging around his neck, plugs a three-prong test cord into the outlet. The other end of the test cord is plugged into the tester. The technician takes readings of the voltage at the outlet pre-test and then presses a loop test button to perform the loop resistance test. The results of the test may be stored in the tester memory. One can appreciate that even when using a lightweight tester, it is nevertheless cumbersome for a technician to position the display close enough to each outlet to run the loop test.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

The following summary is provided to introduce a selection of concepts in a simplified form that are further described below in the Detailed Description. This summary is not intended to identify key features of the claimed subject matter, nor is it intended to be used as an aid in determining the scope of the claimed subject matter.

It is desirable to have a test system that is less cumbersome for the technician. It is also desirable to permit two or more technicians to simultaneously test circuit breakers and record the results on a single device. It is further desirable to separate the physical testing function from the test result recording function and to space the heat-generating portions of the system from the records storage portions of the system.

The foregoing desired features and functions are achieved by various embodiments of the invention that separate the physical electrical testing functions from the recording and display functions. More specifically, embodiments disclosed herein provide an installation test system with dedicated test devices and a control device that records and displays results of the tests made by the dedicated testing units. Each of one or more dedicated, hand-held test devices performs at least one dedicated test. For example, one performs the RCD test and injects current into a circuit breaker. Another performs a loop resistance test and inserts a known resistance into a live circuit to measure the loop resistance. Other testing devices could comprise units for conducting insulation and ground tests. In another embodiment, the insulation and ground test functions may remain in the control device since they are pre-power tests and are not repeated during annual inspections.

Embodiments of the present disclosure are less cumbersome than prior art multifunction testers. They allow a technician to place a control device in a breaker room and conduct tests on each circuit breaker using one or more hand-held RCD test devices. If one RCD testing device heats up, the technician may use another RCD test device and allow the first test device to cool down. The individual RCD test device may be a less complex device, for example, comprising a power supply, measurement and operation circuits, test probe, functional switches to set RCD parameters, and a wireless transceiver.

Another separable test is loop impedance. A loop impedance test device may be configured as a separate hand-held unit. The loop impedance test device may have a power supply, measurement and operation circuits, a display, functional switches to set parameters for executing loop impedance tests, and a wireless transceiver. It has a test cord ending in a three-prong plug that is inserted into an outlet. During a test, the loop test device measures the voltage at the outlet, then inserts a low value, known resistance between a phase and neutral and measures the voltage again. Any differences in voltage measurements are representative of a loop fault.

The control device and each hand-held test device have wireless transceivers for exchanging data and control information. A suitable wireless communications protocol links or binds the test devices to the control device. Two or more technicians in a breaker room may simultaneously operate RCD testers and transmit their respective test results to the control device.

The control device receives the test results from each test device and records the test results in a record that lists the breakers. The loop resistance tests are recorded outlet-by-outlet. Each outlet may be identified by a suitable naming convention. For example, each outlet may be designated by floor, room on floor, and by a serial number within each room.

In an embodiment, data control, insulation testing, and ground testing are performed under control of the control device. Insulation testing is performed on each circuit. The control device is coupled to each circuit, one circuit at a time. A 500 V DC source is imposed on the circuit and readings are taken of the current in the circuit, if any. The test is to identify if there is a short circuit, breakdown or degradation of the wiring insulation.

The control device also performs a ground test of the building before the power is turned on to ensure the building has a safe and operative ground and then at periodic intervals thereafter. This ensures that the ground resistance does not increase over time. Typically, there is a large ground lug referred to as earth ground. Probes are placed on the ground lug of the breaker box, on the ground rod of the building and on another rod inserted into dirt a specified distance from the ground rod, a known current is applied across the probes and the voltage is measured and the ground resistance is then calculated.

In another embodiment of the system, a control device has a display, a processor, storage, one or more probes for connecting to a circuit under test, a measurement system, a wireless transceiver, and one or more programs stored in memory or pre-programmed into the processor. The processor operates the programs to perform one or more tests on a circuit using the measurement system. A technician may operate the control device using an input/output interface (such as a keyboard) for entering commands or data. The wireless transceiver receives test data and other information from discrete, dedicated, hand-held test devices. The processor stores the test data or test information from the test devices in memory storage of the control device.

The system has one or more discrete, dedicated, hand-held test devices, and each test device performs at least one test on a circuit. The test devices have one or more measuring circuits for measuring a circuit parameter and one or more probes for connecting the test device to the circuit under test. Each test device has an interface including one or more switches for selecting test parameters, a display for showing test results, and a wireless transceiver to communicate test data and other information to the control device.

It is a feature of the system that the control device and the test device each perform at least one or more tests selected from the group consisting of residual current detection testing, loop impedance testing, insulation testing, and ground testing.

The embodiments described herein allow two or more technicians to conduct RCD and loop impedance tests at the same time as long as the tests are not conducted simultaneously on the same circuit. The embodiments also allow two or more technicians to simultaneously conduct RCD and loop impedance tests using the same control device. These features of the embodiments save time by allowing multiple tests to be conducted at the same time. With multifunction installation testers, a single instrument is used to conduct all tests and there is no separation of the control and recording of results from the execution of the tests.

Test devices that are dedicated to one test are less bulky than the prior multifunction installation test devices and enable the technician to pay more attention to proper lead placement and avoid problems such as when a circuit breaker probe slips off a breaker contact during a test. The technician is not distracted from changing his attention from one device to another, but may devote his entire attention to the test device. A successful test will be indicated on the display of the test device.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Embodiments of the present disclosure are generally directed to installation systems having one or more hand-held test devices and an installation test and data control device, individual components, and methods of using such systems and components for measuring parameters, such as electrical, mechanical, and physical measurement parameters. The embodiments described herein are useful for installing electrical systems, performing annual inspections, testing or monitoring a plurality of measurement parameters, which may be in multiple different locations, some in hard to reach locations.

Prior to discussing the details of various aspects of the present disclosure, it should be understood that one or more sections of the following description may be presented in terms of logic and operations that may be performed by conventional electronic components. These electronic components, which may be grouped in a single location or distributed over a wide area, generally include controllers, microcontrollers, control units, processors, microprocessors, etc. It will be appreciated by one skilled in the art that any logic described herein may be implemented in a variety of configurations, including, but not limited to, hardware, software, and combinations thereof. The hardware may include, but is not limited to, analog circuitry, digital circuitry, processing units, application-specific integrated circuits (ASICs), and the like, and combinations thereof. In circumstances in which the components of the system are distributed, the components are accessible to each other via communication links.

While various embodiments are illustrated and described below, it will be appreciated that various changes can be made therein without departing from the spirit and scope of the disclosure. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Additionally, it will be appreciated that embodiments of the present disclosure may employ any combination of the features described herein.

Figure 1A:
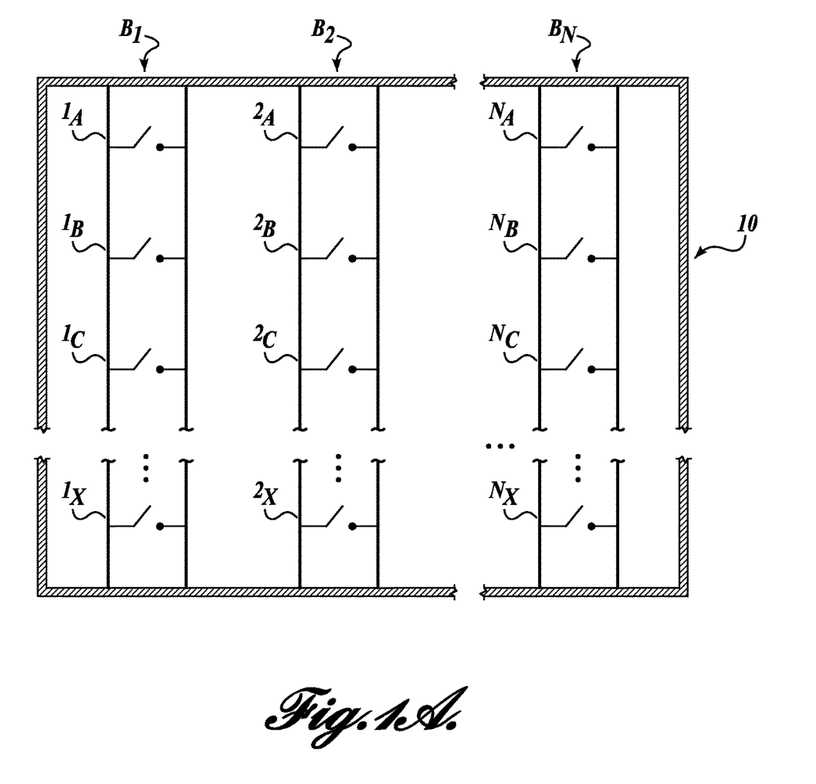
FIG. 1A is a schematic representation of a circuit breaker panel with multiple circuit breakers.
Figure 1B:
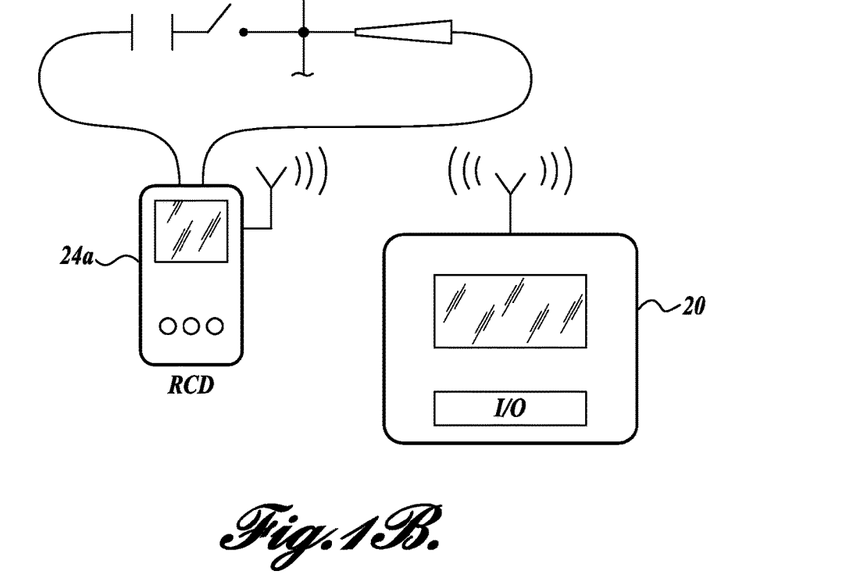
FIG. 1B is a schematic representation of one embodiment of a system comprising an installation test and data control device and a hand-held test device for performing RCD testing.
Figure 1C:
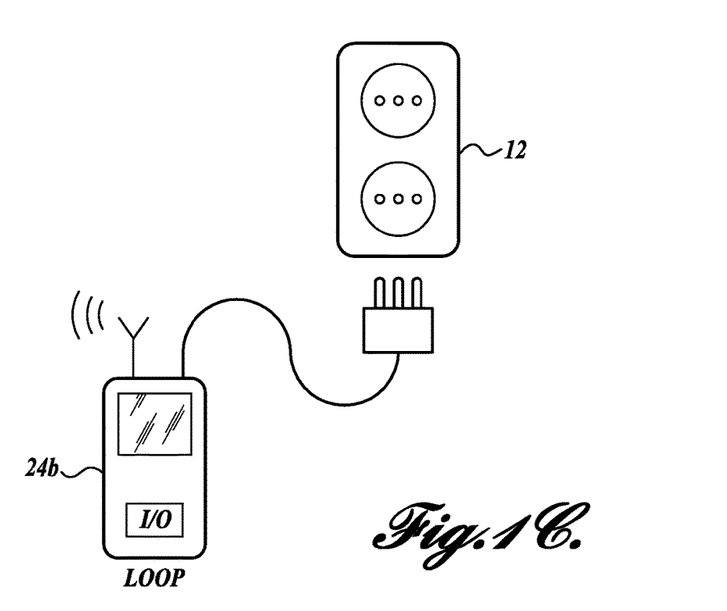
FIG. 1C is a schematic representation of one embodiment of a system comprising a hand-held test device for performing loop testing at an outlet.

Turning to FIG. 1A, there is shown a breaker panel 10 with a large number of columns of breakers, $B_1, B_2 \ldots B_N$. Each column of breakers contains multiple breakers. For example, in column $B_1$ the breakers begin at the uppermost breaker $1_A$ and extend to the last breaker $1_X$. There may be hundreds of breakers in a typical panel and/or breaker room. A typical breaker is schematically shown in FIG. 1B. Shown in FIG. 1C is a typical three-prong receptacle outlet 12. A control device 20 has wireless communication with a first test device 24a for testing RCD in breakers and with a loop impedance test device 24b for testing loop impedance at an outlet 12.

Figure 2:
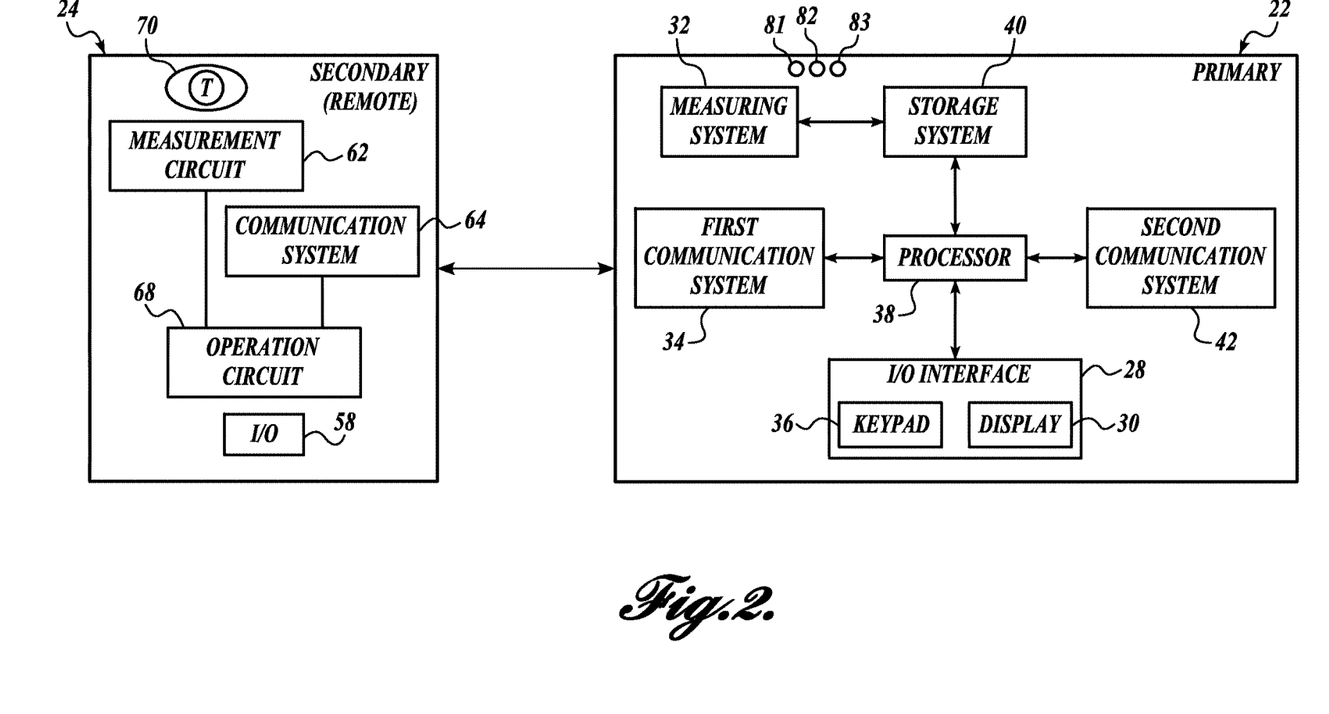
FIG. 2 is a block diagram of a system comprising an installation test and data control device and a hand-held test device.

Turning to FIG. 2, a test device 24 will now be described in greater detail. The test device 24 may be, for example, an RCD test device (see FIG. 3) or a loop impedance test device (see FIG. 4). The measurements made by the test device 24 may be an electrical, mechanical, or physical parameter, including, but not limited to, voltage, current, vibration, resistance, capacitance, inductance, frequency, temperature, relative humidity, magnetic field, flow velocity, moisture, rotations per minute, pressure, distance, light, contact infrared, decibels, and or a calculated value derived from a primary measurement, such as wattage, power quality, crest factor, and duty cycle.

In one embodiment (FIG. 1B), the test device 24a injects current into a circuit breaker and measures the time between application of injected current and tripping the circuit breaker and the current at tripping. In another embodiment (FIG. 1C), the test device 24b measures the loop resistance at an outlet before and after applying a low resistance across two conductors of the outlet.

Figure 3:
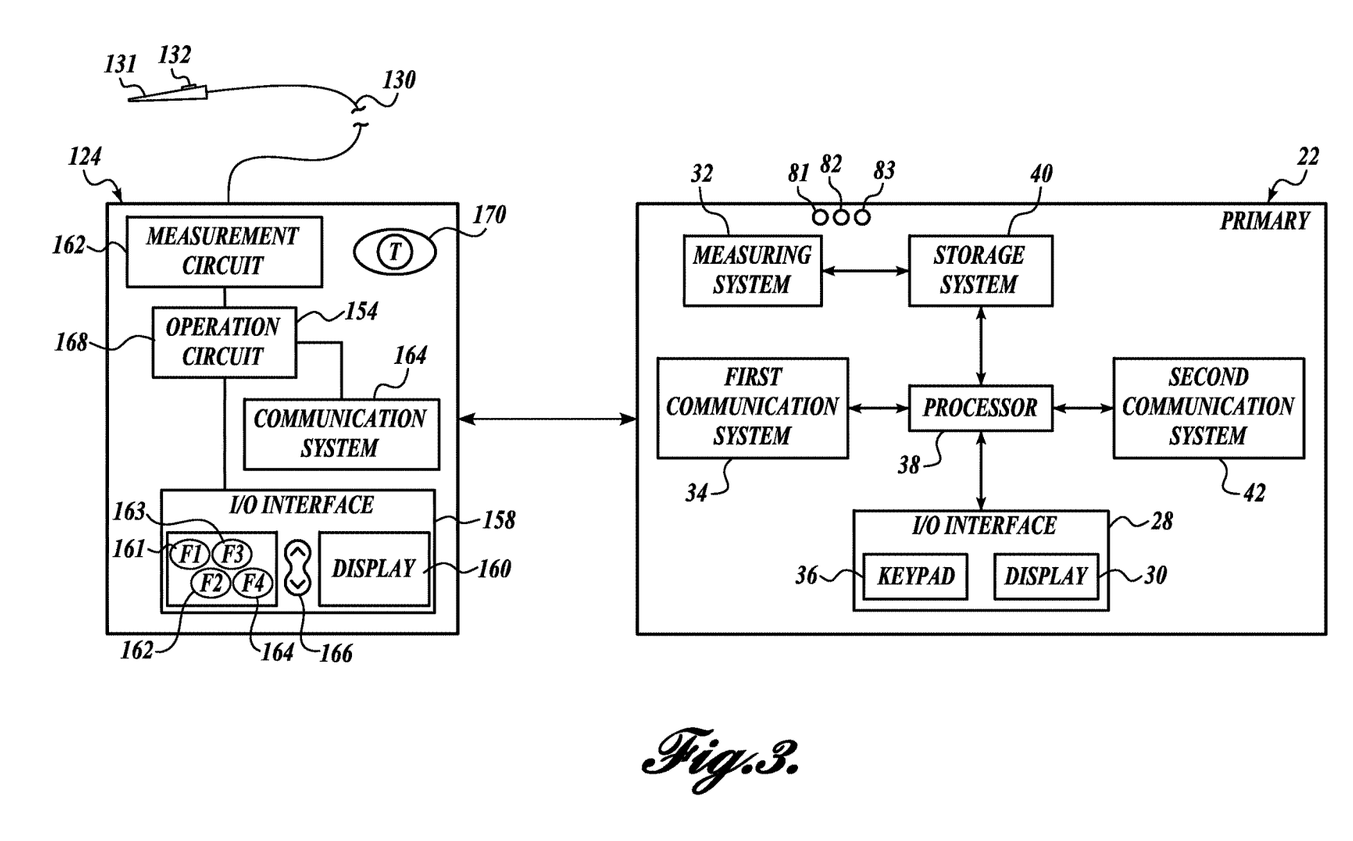
FIG. 3 is a block diagram of an embodiment of an RCD hand-held test device.

Returning to the illustrated embodiment of FIG. 2, the test device 24 includes various components such as an input/output (I/O) interface 58 (including, for example, an optional display 160 and an input interface 166 for user input; see FIG. 3), a measurement circuit 62 for taking measurements, a communication system 64 for receiving and/or transmitting information, and an operation circuit 68. The test device 24 does not require a display 60, but may include one.

The operation circuit 68 may be an application-specific integrated circuit (ASIC), a programmed logic circuit, or a circuit made with digital and analog devices wired together on a printed circuit board for operating the circuits and systems of the test device 24, including the measuring circuit and the communication system 64. The operation circuit 68 generally operates at lower logic levels of voltage and current. The measurement circuit 62 is shown as a separate block and is designed to handle voltages and current that are generally at higher levels than the lower, logic levels of voltage and current used by the operation circuit 68. Such measurement circuits 62 may include one or more power mosfets or integrated circuit bipolar transistors (IGBTs).

The test device 24 has a test button 70. When a technician presses the test button 70, the operation circuit 68 directs the measurement circuit 62 to execute the predetermined measurement function of the test device 24 and apply the appropriate current or voltage to the test probe(s) (not shown). The interface 58 may include one or more functional buttons to set test parameters and may also include a display to show the results of the test.

Still referring to FIG. 2, the components of the control device 22 will now be described in greater detail. The control device 22 may include various components such as an input/output (I/O) interface 28 (including, for example, a display 30 and an input interface 36 for user input), a measuring system 32 for taking measurements, a first communication system 34 for receiving and/or transmitting information, a central processing unit (CPU) or processor 38, and a storage system 40 for storing information. The control device 22 may further include an optional second communication system 42. The measuring system 32 is designed to handle voltages and current operating at higher current and voltage levels than the lower, logic levels of voltage and current used by processor 38. Measuring system 32 includes one or more power mosfets or integrated circuit bipolar transistors (IGBTs).

Depending on the particular configuration and type of device, the storage system 40 may include system memory in the form of volatile or nonvolatile memory, such as read only memory ("ROM"), random access memory ("RAM"), EEPROM, flash memory, or other memory technology. Those of ordinary skill in the art and others will recognize that system memory typically stores data and/or program modules that are immediately accessible to and/or are currently being operated on by the processor 38. In this regard, the processor 38 serves as a computational center of the control device 22 by supporting the execution of program instructions.

The memory may also include storage memory. The storage memory may be any volatile or nonvolatile, removable or non-removable memory, implemented using any technology capable of storing information. Examples of storage memory include, but are not limited to, a hard drive, solid state drive, CD ROM, DVD, or other disk storage, magnetic cassettes, magnetic tape, magnetic disk storage, and the like. The information stored in the storage memory may include, but is not limited to, program modules and data to be accessed by the processor 38. Generally, program modules may include routines, applications, objects, components, data structures, etc., that perform particular tasks or implement particular abstract data types. It will be appreciated that system memory and storage memory described herein are merely examples of various computer-readable storage media.

The storage system 40 may also be configured to store information received from the measuring system 32 of the control device 22 and from measurement circuits 62 in test devices 24 received through the first communication system 34. When information is received in the storage system 40, the processor 38 may be configured to execute instructions to directly display the information received from the measuring system 32 or from the first communication system 34 on the display 30.

For user interaction with the control device 22, the I/O interface 28 may include a variety of components that enable the processor 38 to obtain inputs from and provide outputs to a user and/or other components in the system 20. Although shown as including a keypad 36 and the display 30 in the illustrated embodiment, the I/O interface 28 may include, but is not limited to, a display, such as an LCD, an LPD, OLED display, etc., a keypad, hard or soft keyboards, a touchpad, controls, physical buttons, scroll wheels, a digital pen, trackballs, a joystick, etc. In at least one embodiment, the display 30 may be configured as an I/O interface, such as a touch screen, without requiring a separate keypad 36. The I/O interface 28 may also receive input from and, in some embodiments, may provide output to one or more test devices 24.

The control device 22 has three input jacks 81, 82, and 83. In an embodiment, the control device 22 has all of the test functions of the prior art 1650 Series Multifunction Tester. In another embodiment, the control device 22 retains only limited function tests such as the test performed before power is connected, including insulation tests and ground tests.

New buildings may require insulation tests before power is connected. Insulation integrity is critical to prevent electric shock. It is generally measured between live conductors and between each live conductor and earth. To measure the insulation resistance, all fuses must be left in, circuit breakers closed, and final circuit switches closed. Measurements are carried out with direct current using a test voltage of 1000, 500, or 250 V, depending on the nominal circuit voltage. The direct current supply is not shown and may be a battery or other suitable source. On single-phase supply systems, insulation testing is normally undertaken using a test voltage of 500 V. The control device 22 generates the required test voltages (selectable) of 50 and 100 V as required for testing telecommunications installations. When taking a measurement, the display 30 indicates both the insulation resistance and the applied test voltage. Suitable leads are connected to the jacks 81, 82 and 83 for performing the insulation tests. An insulation testing program is installed in the storage 40 and the keyboard 36 is operated to cause the processor 38 to execute the program and run the insulation test.

In the depicted embodiment, the control device 22 also retains the operational function of testing ground connections for a new building. Control device 22 measures the resistance of an earth electrode by using two auxiliary earth electrodes or 'spikes'. Before power is connected to the building, the earthing rod of the building is disconnected from the installation's main earthing terminal. In doing this, the installation will consequently have no earth protection and therefore must be completely deenergized prior to testing. In at least one implementation, an auxiliary electrode is placed at a set distance from the earth electrode, and another at 62 percent of the distance between the two in a straight line. The test measures the earth resistance and also detects the voltage between the auxiliary electrodes, and if this exceeds 10 V, the test is inhibited. A ground testing program is installed in the storage 40 and the keyboard 36 is operated to cause the processor 38 to execute the program and run the ground test.

The first communication system 34 includes one or more components for communicating with one or more discrete test devices 24 (as can be seen in FIG. 2) using a suitable wired or wireless communication protocol for transmitting and/or receiving information, including, but not limited to, USB, WiFi, or BLUETOOTH. In an embodiment of the present disclosure, the information is communicated in the system 20, for example, from the test device 24 to the control device 22, by a radio signal using a proprietary communication protocol. Other embodiments may communicate using standardized communication protocols.

Upon receipt of test data or information from a test device 24, the control system records the test data in storage 40. The recorded information may be recorded in pre-formatted electronic forms that associate the data with pre-recorded information regarding each circuit breaker and each outlet under test.

Further, the control device 22 may include additional communication circuitry, such as a second communication system 42, for communicating with a separate computing device, for example, a mobile computing device, such as a tablet or a smart phone, a personal computing device, a laptop computing device, a personal digital assistant, and the like. The communication circuitry may include modems, transmitter/receiver, and/or transceiver circuitry, for performing communications over one or more networks. To communicate wirelessly, the communication circuitry of either the first or second systems 34 or 42 may include one or more suitable antennas (not shown). For ease of illustration, FIG. 2 does not depict analog-to-digital converters, digital-to-analog converters, amplifiers, device controllers, etc., which will typically be included with the communication circuitry. However, because these and other components that may be included with the communication circuitry are known in the art, they will not be described in detail herein.

In some embodiments, the control device 22 can be configured for communicating with a computing device, and to include a communication device that can be coupled via near field protocols, infrared protocols, BLUETOOTH protocols, IEEE 802 protocols, wired connections, such as a USB, Ethernet, or RS232 connection, etc.

Turning to FIG. 3, the control device 22 in other embodiments remains at one location and the technician tests the circuit breakers on the breaker panel 10 using a separate dedicated RCD test device 124. If the test device 124 becomes too hot for multiple tests, the technician may use a second RCD test device 124 while the first one cools down. One or more additional technicians may perform RCD tests on the breakers and simultaneously transmit their test results to the control device 22 during a same testing interval of time.

Figure 4:
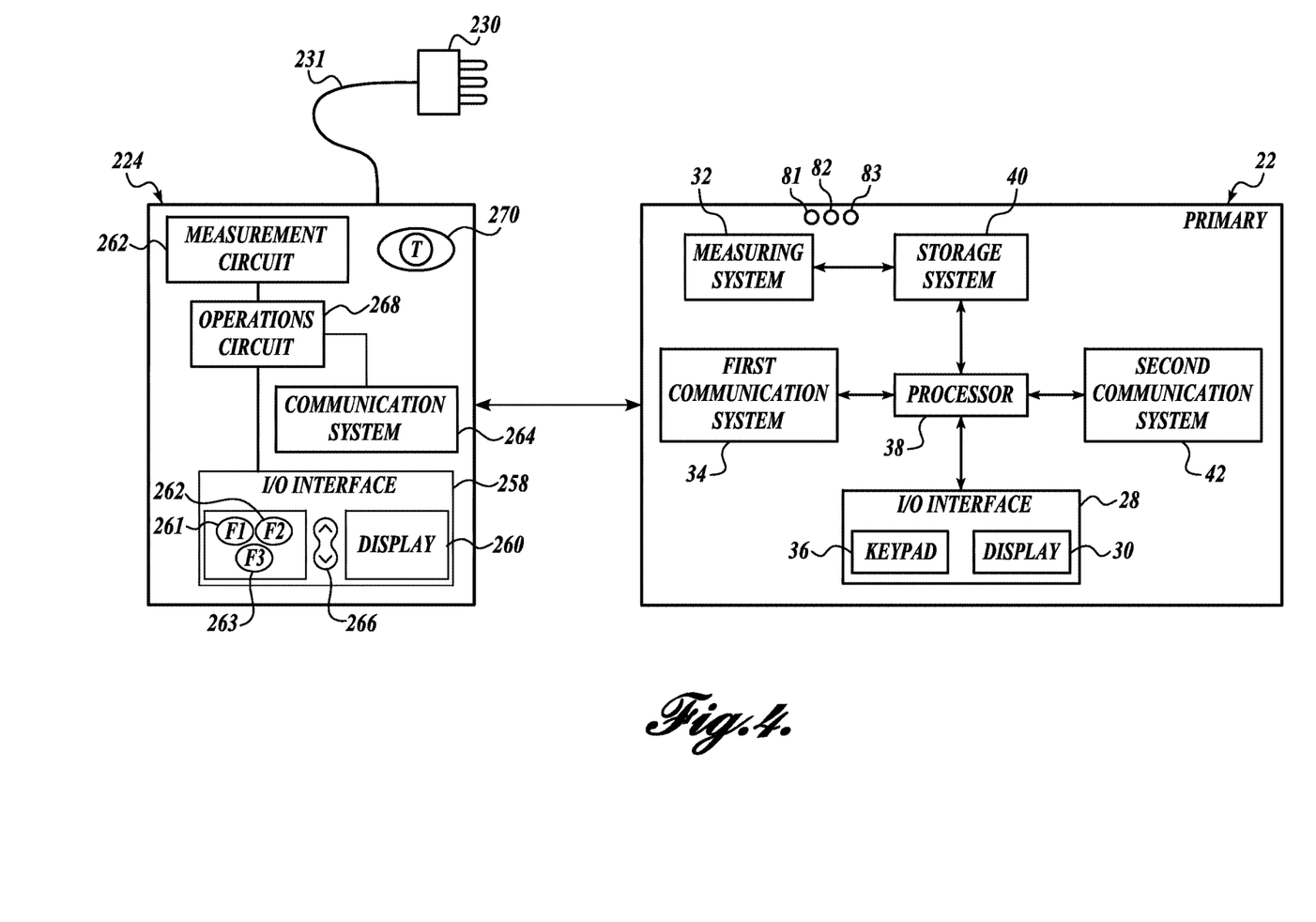
FIG. 4 is a block diagram of an embodiment of a loop impedance hand-held test device.

Upon completion of the RCD tests, the technician tests each outlet 12 (FIG. 1C) and performs loop impedance tests using a loop impedance test device 224, as illustrated in FIG. 4. If more than one technician is performing such tests, each technician is assigned to different circuits so that outlets on the same circuit run are not simultaneously subjected to loop impedance testing.

Referring to FIG. 3, the dedicated RCD test device 124 includes a probe 131 that may be contacted to a circuit breaker. Test current is injected from the test device 124 into the circuit breaker via a wire 130. The test may be initiated by a test button 132 on the probe or by the test button 170 on the test device.

An interface 158 includes a set of functional buttons 161-164, a scroll switch 166, and a display 160. The functional buttons allow the technician to set test parameters for the RCD test. The first button 161 is for the RCD current rating. While 30 ma is a common setting, RCDs may be set to trip at 10, 30, 100, 300, 500, 1000 ma, or some other current. Upon pressing button 161, a default current appears in the display. The technician uses the scroll switch 166 to scroll up or down to the RCD current rating for the circuit breaker under test.

Button 262 is an RCD current multiplier which may be set by scroll switch 166 to values of 0.5×, 1.0×, 5.0×, or Automatic. Button 163 selects the RCD type and using scroll switch 166, the type may be selected from for the following list: AC (sinusoidal), AC selective, half-wave, selective wave, DC, or other selective wave. Button 164 operates with scroll switch 166 to let the technician select an RCD test polarity of 0 or 180 degrees. The display 160 shows the selection made by the combined operations of the functional buttons 161-164 and the scroll switch 166. Upon pressing the test button 170, the particular test parameters for injected current are applied to the circuit breaker under test by the tip of the probe 131.

The other components of the test device 124 include a measurement circuit 162 for applying the injected current and for taking time and current measurements, a communication system 164 for receiving and/or transmitting information, and an operation circuit 168. The operation circuit 168 may be an application-specific integrated circuit (ASIC), a programmed logic circuit or a circuit made with digital and analog devices wired together on a printed circuit board for operating the circuits and systems of the test device 124, including the measuring circuit 162 and the communication system 164. The operation circuit 154 generally operates at lower logic levels of voltage and current. The measuring circuit 162 is shown as a separate block and is designed to handle voltages and current that are generally at higher levels than the lower, logic levels of voltage and current used by the operation circuit.

For each circuit breaker with the same parameters, the technician places the probe on one leg of the breaker. With the breaker in the closed position, the technician injects the predetermined current into the breaker. The test device 124 then measures the time it takes for the breaker to open and the current that opens the breaker. The information for the test appears on the display and is sent via communication system 164 to the control device 22. The control device 22 may return an acknowledgement signal indicating the information was received and recorded in storage 40.

Referring to FIG. 4, there is shown a separate, dedicated loop impedance test device 224. It includes a probe cord 231 extending from the device 224 and terminating in a three-prong plug 230. The plug is inserted into a three-prong receptacle 12, e.g., as illustrated in FIG. 1C.

An interface 258 includes a set of functional buttons 261-263, a scroll switch 266, and a display 260. The functional buttons allow the technician to set test parameters for loop impedance tests. The first button 261 is for selecting the loop. Using scroll button 266, the technician may select the L-N loop of the L-PE loop, where L=live, N=neutral, and PE=protective earth. Button 262 selects the impedance test accuracy.

Typical ranges are ohms and milliohms and scroll button 266 is used to make the selection. Button 263 operated with scroll button 266 selects earth resistance $R_E$ or prospective earth fault current $I_K$.

For each outlet, the technician places the plug 230 into the outlet and runs an impedance test by pressing the test button 270. The test device 224 then measures loop resistance and/or current sensed in the large resistor and transmits that information to the control device 22 via communication system 264. The control device 22 may return an acknowledgement signal indicating the information was received and recorded in storage 40.

The other components of the test device 224 include a measurement circuit 262 for measuring resistance or current, a communication system 264 for receiving and/or transmitting information, and an operation circuit 268. The operation circuit 268 may be an application-specific integrated circuit (ASIC), a programmed logic circuit, or a circuit made with digital and analog devices wired together on a printed circuit board for operating the circuits and systems of the test device 224, including the measurement circuit 262 and the communication system 264. The operation circuit 268 generally operates at lower logic levels of voltage and current. The measurement circuit 262 is shown as a separate block and is designed to handle voltages and current that are generally at higher levels than the lower logic levels of voltage and current used by the operations circuit.

While the above embodiments describe dedicated single-test test devices for RCD testing and loop impedance testing, other embodiments may include further single-test devices for testing continuity, circuit separation, floor and wall resistance, polarity testing, and each of the other tests presently performed by present Multifunction Installation Testers. Likewise, one or more of such other tests may also be performed by the control unit 22.

Other embodiments disclosed herein include dedicated test devices 24 that perform two or more tests. Such embodiments will have additional measurement circuits. Still other embodiments include a control device 22 capable of performing the tests of the dedicated testing units.

While illustrative embodiments have been illustrated and described, it will be appreciated that various changes can be made therein without departing from the spirit and scope of the invention.

The invention claimed is:

1. A system for installation testing comprising:
   a control device, a separate first hand-held device, and a separate second hand-held test device, the control device having a wireless receiver for wirelessly receiving test information from the first and second hand-held test devices,
   wherein the control device electrically couples to at least one circuit in a circuit breaker panel having multiple circuit breakers and performs at least one test selected from the group consisting of residual current detection testing, loop impedance testing, insulation testing, and ground testing using measurement circuitry located in the control device when coupled to a circuit in the circuit breaker panel;
   wherein the first hand-held test device performs residual current detection testing using measurement circuitry located in the first hand-held test device when the first hand-held test device is coupled to a circuit breaker in the circuit breaker panel;
   wherein the second hand-held test device performs loop impedance testing using measurement circuitry located in the second hand-held test device when the second hand-held test device is plugged into individual electrical outlets; and
   wherein the test information received by the control device from the first and second hand-held test devices is based on the testing performed by the respective first and second hand-held test devices,
   the system further comprising one or more additional hand-held test devices, wherein each additional hand-held test device performs at least one test selected from the group consisting of residual current detection testing, loop impedance testing, insulation testing, and ground testing using measurement circuitry located in the respective hand-held test device, and wherein the wireless receiver of the control device is configured to wirelessly receive test information from each of the additional hand-held test devices based on the at least one test performed by each of the additional hand-held test devices.

2. The system of claim 1, wherein the first hand-held test device is dedicated to performing a residual current detection test.

3. The system of claim 1, wherein the second hand-held test device is dedicated to performing a loop impedance test.

4. The system of claim 1, wherein the control device has a processor, storage, and one or more programs stored in storage that, when executed, cause the control device to receive and store test data, and one or more test probes for conducting insulation testing and ground testing.

5. An installation and inspection system for testing new or existing circuits comprising:
   a control device having a display, a processor, storage, one or more probes for connecting to a circuit under test, a measuring system, and one or more programs stored in storage or pre-programmed into said processor, said programs for operating the processor to perform one or more tests on a circuit using the measuring system, said one or more tests selected from the group consisting of residual current detection testing, loop impedance testing, insulation testing, and ground testing, an input/output interface for entering commands or data and indicating test results, and a wireless transceiver for receiving test information;
   a first test device adapted to perform a residual current detection test on a circuit, said first test device being separate from the control device and having a measuring circuit that measures one or more circuit parameters, one or more probes that connect the measuring circuit in the first test device to a circuit under test, an interface including one or more switches for selecting one or more test parameters, a display for showing test parameters or test data, and a wireless transmitter to communicate test information based on the residual current detection test to the control device, and
   a second test device adapted to perform a loop impedance test on a circuit, said second test device being separate from the first test device and having a measuring circuit that measures one or more circuit parameters, one or more probes that connect the measuring circuit in the second test device to a circuit under test, an interface including one or more switches for selecting one or more test parameters, a display for showing test parameters or test data, and a wireless transmitter to communicate test information based on the loop impedance test to the control device.

6. The system of claim 5, wherein the control device is adapted to perform insulation testing.

7. The system of claim 5, wherein the control device is adapted to perform ground testing.

8. The system of claim 5, wherein the first test device is dedicated to performing residual current detection testing.

9. The system of claim 5, wherein the second test device is dedicated to performing loop impedance testing.

10. The system of claim 8, wherein the first test device has a probe for contacting a contact of a circuit breaker and for injecting current into the circuit breaker.

11. The system of claim 9, wherein the second test device has a test cord with a multi-prong plug for connecting to an outlet to conduct the loop impedance testing.

12. The system of claim 8, wherein the wireless transceiver of the control device is further adapted to wirelessly transmit test information to a separate computing device.

13. An installation and inspection method for testing new or existing circuits comprising:
   providing a control device with a processor, storage for holding measurement data, a measuring system for applying a test of an electrical parameter, and a wireless transceiver;
   providing a first hand-held test device with a measurement circuit that performs residual current detection testing of one or more circuits;
   providing a second hand-held test device with a measurement circuit that performs loop impedance testing of one or more circuits;

operating the control device to perform at least one of an insulation test and a ground test;
operating the first hand-held test device to perform a residual current detection test;
operating the second hand-held test device to perform a loop impedance test;
wirelessly transmitting results based on the tests performed by the first and second hand-held test devices to the control device;
providing at least a third hand-held test device with a measurement circuit, and operating the third hand-held test device such that the third hand-held test device performs a loop impedance test; and
recording the wirelessly transmitted results in the storage of the control device.

14. The installation and inspection method of claim 13, wherein the first hand-held test device is dedicated to performing the residual current detection test.

15. The installation and inspection method of claim 13, wherein the second hand-held test device is dedicated to performing the loop impedance test.

16. An installation and inspection method for testing new or existing circuits comprising:
providing a control device with a processor, storage for holding measurement data, a measuring system configured to perform one or more tests selected from the group consisting of residual current detection testing, loop impedance testing, insulation testing, and ground testing, and a wireless transceiver;
providing two or more hand-held test devices, wherein each hand-held test device is configured to perform residual current detection testing using a measurement circuit located in the respective hand-held test device;
operating the two or more hand-held test device such that each hand-held test device performs a residual current detection test of a different circuit during a same testing interval of time;
wirelessly transmitting results based on the testing performed by the two or more hand-held test devices to the control device;
providing at least a third hand-held test device with a measurement circuit, and operating the third hand-held test device such that the third hand-held test device performs a loop impedance test; and
recording the wirelessly transmitted results in the storage of the control device.

17. The installation and inspection method of claim 16, further comprising operating the control device such that the control device performs at least one of an insulation test and a ground test on a first circuit and simultaneously operating at least one of the two or more hand-held test devices to perform a residual current detection test of a second circuit that is different from the first circuit.

18. The installation and inspection method of claim 16, wherein the two or more hand-held test devices are dedicated to performing a residual current detection test.

19. The system of claim 1, further comprising at least a third hand-held test device that performs residual current detection testing using measurement circuitry located in the third hand-held test device when the third hand-held test device is coupled to a circuit breaker in the circuit breaker panel that is different from the circuit breaker to which the first hand-held test device is coupled, wherein the first hand-held test device and the third hand-held test device are configured to perform the residual current detection testing during a same testing interval of time and wirelessly transmit test information based on the residual current detection testing to the control device.

20. The system of claim 5, further comprising at least a third test device adapted to perform a residual current detection test on a circuit, said third test device having a measuring circuit for measuring one or more circuit parameters, one or more probes for connecting to a circuit under test, an interface including one or more switches for selecting one or more test parameters, a display for showing test parameters or test data, and a wireless transmitter to communicate test information based on the residual current detection test to the control device, wherein the first test device and the third test device are adapted to perform the residual current detection test on different circuits during a same testing interval of time and wirelessly transmit the respective test information to the control device.

* * * * *